US005657018A

United States Patent [19]
Kohno et al.

[11] Patent Number: 5,657,018
[45] Date of Patent: Aug. 12, 1997

[54] BAR GRAPH DECODER OUTPUTTING THERMOMETER CODE

[75] Inventors: Hiroyuki Kohno; Yasuyuki Nakamura; Takahiro Miki, all of Hyogo, Japan

[73] Assignee: Mitsubishi Denki Kabushiki Kaisha, Tokyo, Japan

[21] Appl. No.: 538,485

[22] Filed: Oct. 3, 1995

[30] Foreign Application Priority Data

Oct. 7, 1994 [JP] Japan .................................. 6-243990

[51] Int. Cl.$^6$ ...................................................... H03M 5/00
[52] U.S. Cl. ............................................................ 341/96
[58] Field of Search ................................ 341/96, 97, 155, 341/159

[56] References Cited

U.S. PATENT DOCUMENTS 5,140,188 8/1992 Burns ........................................ 307/362

OTHER PUBLICATIONS

"Entrance into A/D Converter," Toshikazu Yoneyama pp. 151–153, Ohm, 1983.

*Primary Examiner*—Brian K. Young
*Attorney, Agent, or Firm*—Lowe, Price, LeBlanc & Becker

[57] ABSTRACT

A bar graph decoder includes input terminals to which 5-bit digital data is input, a logic circuit for outputting a thermometer code changing continuously at a constant ratio in response to the input data, and output terminals connected to the logic circuit for outputting switch select signals according to the digital input. The logic circuit is configured only of 2-input OR circuits and 2-input AND circuits. As a result, a bar graph decoder having a simple configuration and a reduced number of elements can be provided.

13 Claims, 17 Drawing Sheets

FIG. 2

INPUT
- B5    0000000000000001111111111111111
- B4    0000000011111110000000011111111
- B3    0000111000011100001111000001111
- B2    0011001100110011001100110011
- B1    0101010101010101010101010101010101

OUTPUT
- SEL1    0111111111111111111111111111111
- SEL2    0011111111111111111111111111111
- SEL3    0001111111111111111111111111111
- SEL4    0000111111111111111111111111111
- SEL5    0000011111111111111111111111111
- SEL6    0000001111111111111111111111111
- SEL7    0000000111111111111111111111111
- SEL8    0000000011111111111111111111111
- SEL9    0000000001111111111111111111111
- SEL10    0000000000111111111111111111111
- SEL11    0000000000011111111111111111111
- SEL12    0000000000001111111111111111111
- SEL13    0000000000000111111111111111111
- SEL14    0000000000000011111111111111111
- SEL15    0000000000000001111111111111111
- SEL16    0000000000000000111111111111111
- SEL17    0000000000000000011111111111111
- SEL18    0000000000000000001111111111111
- SEL19    0000000000000000000111111111111
- SEL20    0000000000000000000011111111111
- SEL21    0000000000000000000001111111111
- SEL22    0000000000000000000000111111111
- SEL23    0000000000000000000000011111111
- SEL24    0000000000000000000000001111111
- SEL25    0000000000000000000000000111111
- SEL26    0000000000000000000000000011111
- SEL27    0000000000000000000000000001111
- SEL28    0000000000000000000000000000111
- SEL29    0000000000000000000000000000011
- SEL30    0000000000000000000000000000001
- SEL31    0000000000000000000000000000001

FIG. 4

|       |      |                                     |
|-------|------|-------------------------------------|
| INPUT | B5   | 000000000000000111111111111111      |
|       | B4   | 000000011111110000000011111111      |
|       | B3   | 000111100011110000111100001111      |
|       | B2   | 001100110011001100110011001100 11   |
|       | B1   | 010101010101010101010101010101 01   |

| OUTPUT | SEL1  | 011111111111111111111111111111 1 |
|--------|-------|----------------------------------|
|        | SEL2  | 001111111111111111111111111111 1 |
|        | SEL3  | 000111111111111111111111111111 1 |
|        | SEL4  | 000011111111111111111111111111 1 |
|        | SEL5  | 000001111111111111111111111111 1 |
|        | SEL6  | 000000111111111111111111111111 1 |
|        | SEL7  | 000000011111111111111111111111 1 |
|        | SEL8  | 000000001111111111111111111111 1 |
|        | SEL9  | 000000000111111111111111111111 1 |
|        | SEL10 | 000000000011111111111111111111 1 |
|        | SEL11 | 000000000001111111111111111111 1 |
|        | SEL12 | 000000000000111111111111111111 1 |
|        | SEL13 | 000000000000011111111111111111 1 |
|        | SEL14 | 000000000000001111111111111111 1 |
|        | SEL15 | 000000000000000111111111111111 1 |
|        | SEL16 | 000000000000000011111111111111 1 |
|        | SEL17 | 000000000000000001111111111111 1 |
|        | SEL18 | 000000000000000000111111111111 1 |
|        | SEL19 | 000000000000000000011111111111 1 |
|        | SEL20 | 000000000000000000001111111111 1 |
|        | SEL21 | 000000000000000000000111111111 1 |
|        | SEL22 | 000000000000000000000011111111 1 |
|        | SEL23 | 000000000000000000000001111111 1 |
|        | SEL24 | 000000000000000000000000111111 1 |
|        | SEL25 | 000000000000000000000000011111 1 |
|        | SEL26 | 000000000000000000000000001111 1 |
|        | SEL27 | 000000000000000000000000000111 1 |
|        | SEL28 | 000000000000000000000000000011 1 |
|        | SEL29 | 000000000000000000000000000001 1 |
|        | SEL30 | 000000000000000000000000000000 1 |
|        | SEL31 | 000000000000000000000000000000 1 |

FIG. 8

|  |  |  |
|---|---|---|
| INPUT | B5 | 0000000000000001111111111111111 |
|  | B4 | 0000000111111110000000011111111 |
|  | B3 | 00001111000011110000111100001111 |
|  | B2 | 0011001100110011001100110011 |
|  | B1 | 0101010101010101010101010101010101 |

|  |  |  |
|---|---|---|
| OUT-PUT | SEL1 | 0111111111111111111111111111111 |
|  | SEL2 | 0011111111111111111111111111111 |
|  | SEL3 | 0001111111111111111111111111111 |
|  | SEL4 | 0000111111111111111111111111111 |
|  | SEL5 | 0000011111111111111111111111111 |
|  | SEL6 | 0000001111111111111111111111111 |
|  | SEL7 | 0000000111111111111111111111111 |
|  | SEL8 | 0000000011111111111111111111111 |
|  | SEL9 | 0000000001111111111111111111111 |
|  | SEL10 | 0000000000111111111111111111111 |
|  | SEL11 | 0000000000011111111111111111111 |
|  | SEL12 | 0000000000001111111111111111111 |
|  | SEL13 | 0000000000000111111111111111111 |
|  | SEL14 | 0000000000000011111111111111111 |
|  | SEL15 | 0000000000000001111111111111111 |
|  | SEL16 | 0000000000000000111111111111111 |
|  | SEL17 | 0000000000000000011111111111111 |
|  | SEL18 | 0000000000000000001111111111111 |
|  | SEL19 | 0000000000000000000111111111111 |
|  | SEL20 | 0000000000000000000011111111111 |
|  | SEL21 | 0000000000000000000001111111111 |
|  | SEL22 | 0000000000000000000000111111111 |
|  | SEL23 | 0000000000000000000000011111111 |
|  | SEL24 | 0000000000000000000000001111111 |
|  | SEL25 | 0000000000000000000000000111111 |
|  | SEL26 | 0000000000000000000000000011111 |
|  | SEL27 | 0000000000000000000000000001111 |
|  | SEL28 | 0000000000000000000000000000111 |
|  | SEL29 | 0000000000000000000000000000011 |
|  | SEL30 | 0000000000000000000000000000011 |
|  | SEL31 | 0000000000000000000000000000001 |

| | | |
|---|---|---|
| INPUT | B3 | 00001111 |
| | B2 | 00110011 |
| | B1 | 01010101 |
| OUTPUT | SEL1 | 01111111 |
| | SEL2 | 00111111 |
| | SEL3 | 00011111 |
| | SEL4 | 00001111 |
| | SEL5 | 00000111 |
| | SEL6 | 00000011 |
| | SEL7 | 00000001 |

FIG. 17A PRIOR ART

INPUT:
```
B4  0000000011111111
B3  0000111100001111
B2  0011001100110011
B1  0101010101010101
```

OUTPUT:
```
SEL1   1000000000000000
SEL2   1100000000000000
SEL3   1110000000000000
SEL4   1111000000000000
SEL5   1111100000000000
SEL6   1111110000000000
SEL7   1111111000000000
SEL8   1111111100000000
SEL9   1111111110000000
SEL10  1111111111000000
SEL11  1111111111100000
SEL12  1111111111110000
SEL13  1111111111111000
SEL14  1111111111111100
SEL15  1111111111111110
VDD    1111111111111111
```

FIG. 17B PRIOR ART

INPUT:
```
B5  00000000000000001111111111111111
B4  00000000111111110000000011111111
B3  00001111000011110000111100001111
B2  00110011001100110011001100110011
B1  01010101010101010101010101010101
```

OUTPUT:
```
SEL1   01111111111111111111111111111111
SEL2   00111111111111111111111111111111
SEL3   00011111111111111111111111111111
SEL4   00001111111111111111111111111111
SEL5   00000111111111111111111111111111
SEL6   00000011111111111111111111111111
SEL7   00000001111111111111111111111111
SEL8   00000000111111111111111111111111
SEL9   00000000011111111111111111111111
SEL10  00000000001111111111111111111111
SEL11  00000000000111111111111111111111
SEL12  00000000000011111111111111111111
SEL13  00000000000001111111111111111111
SEL14  00000000000000111111111111111111
SEL15  00000000000000011111111111111111
SEL16  00000000000000001111111111111111
SEL17  00000000000000000111111111111111
SEL18  00000000000000000011111111111111
SEL19  00000000000000000001111111111111
SEL20  00000000000000000000111111111111
SEL21  00000000000000000000011111111111
SEL22  00000000000000000000001111111111
SEL23  00000000000000000000000111111111
SEL24  00000000000000000000000011111111
SEL25  00000000000000000000000001111111
SEL26  00000000000000000000000000111111
SEL27  00000000000000000000000000011111
SEL28  00000000000000000000000000001111
SEL29  00000000000000000000000000000111
SEL30  00000000000000000000000000000011
SEL31  00000000000000000000000000000001
```

BAR GRAPH DECODER OUTPUTTING THERMOMETER CODE

BACKGROUND OF THE INVENTION

1. Field of the Invention

The present invention relates to bar graph decoders outputting a thermometer code changing continuously at a constant ratio in response to a digital input signal, and more particularly, to a bar graph decoder configured of a simple logic gate.

2. Description of the Background Art

A D/A converter converting a digital signal into an analog signal is indispensable in the field of commercial electronic appliances for measurement, control, communication and the like. A D/A conversion technique often used generally includes a weighted resistance method and a method of dividing voltage by resistance. These two methods will be described briefly hereinafter.

First, the weighted resistance method will be described. FIG. 13 is a schematic diagram showing a configuration of a D/A converter according to the weighted resistance method. Referring to FIG. 13, the D/A converter according to the weighted resistance method includes n pairs $S_O$ to $S_{n-1}$ for switching each formed of a p channel transistor and an n channel transistor and provided for each bit to which input is supplied, and resistors $R_o$ to $R_{n-1}$ connected thereto and each having a resistance value with a binary weight. The D/A converter further includes a reference voltage supplying terminal 51 connected to a resistance network by switches $S_0$ to $S_{n-1}$ turning on and off for supplying a reference voltage VR, and an element 52 such as an operational amplifier collecting current flowing through the resistance network in order to generate a signal in proportion to a digital input.

Operation of the D/A converter will now be described. In response to n-bit digital input signals $a_0$ to $a_{n-1}$, switches $S_O$ to $S_{n-1}$ are turned on and off. If input signal $a_0$ is "1" for example, the n channel transistor is turned on, and there is a current flow of VR/r through resistor $R_0$. If input signal $a_0$ is "0", the p channel transistor is turned on, and there is no current flow through resistor $R_0$. As to the state of a switch Si, it may be considered that switch Si is connected to VR when ai=1, and that switch Si is grounded when ai=0. Therefore, a sum I of current flows through resistors $R_0$ to $R_{n-1}$ is:

$$I=(a0/r+a1/2r+a2/2^2r+a3/2^3r+\ldots+an-1/2^{n-1}r)=VR\Sigma ai/r^i$$

An output voltage VO of an operational amplifier is:

$$VO=I\cdot(-r/2)=-VR\Sigma ai\cdot 2^{-i}$$

Therefore, this circuit operates as the D/A converter.

Operation will now be described of the method of dividing voltage by resistance. When configuring the D/A converter, it is possible to obtain a thermometer code also by preparing $2^{n-1}$ voltages which satisfy Vi=i·LSB and selecting one of the voltages. FIG. 14 is a schematic diagram showing a configuration of a 3-bit D/A converter using such a method of dividing voltage by resistance. Referring to FIG. 14, by connecting eight ($2i=2^3=8$) identical resistors r in series, connection points of respective resistors (portions indicated by arrows in FIG. 14) apparently correspond to respective digital inputs, and the voltages thereof are 0, 1LSB, 2LSB, ... $2^{n-1}$ LSB (MSB). Therefore, by decoding the digital input signal and turning on one of switches $SW_0$ to $SW_{n-1}$ provided at the connection points of respective resistors, an analog output can be obtained accordingly. In the example shown in FIG. 14, an output of (⅝) VR can be obtained with respect to digital input "101".

In the method of dividing voltage by resistance, a bar graph decoder 53 generating a signal turning on and off switches $S_0$ to $S_{n-1}$ in response to the n-bit digital input $(A_{n-1}, \ldots, A_1, A_0)$ is provided in addition to operational amplifier 52 described with respect to the weighted resistance method.

As described above, bar graph decoder 53 is a necessary circuit for turning on and off switches $SW_0$ to $SW_{n-1}$ in configuring the D/A converter using the method of dividing voltage by resistance. Bar graph decoder 53 in the above described D/A converter selects only an arbitrary switch among a plurality of switches. Description will now be given of a bar graph decoder which outputs a thermometer code corresponding to an input signal.

First, a 3-bit bar graph decoder which can be configured of simple logic and composite gates will be described as a conventional bar graph decoder with reference to FIG. 15. FIG. 15A is a schematic diagram showing a configuration of the 3-bit bar graph decoder, and FIG. 15B is a diagram showing data input to the bar graph decoder and data output therefrom.

Referring to FIG. 15A, a conventional bar graph decoder 101 includes input terminals 1c to 1e to which digital data (B3, B2, B1) are input, a logic circuit unit 100 connected to input terminals 1c to 1e and preparing switch select signals for obtaining an output signal corresponding to the input data, and output terminals 101a to 101g connected to logic circuit unit 100 and outputting switch select signals SEL1 to SEL7. Logic circuit unit 100 includes a 3-input OR circuit 100a, a 2-input OR circuit 100b, and a 2-input AND-2-input OR circuit 100c, a 2-input OR-2-input AND circuit 100d, a 2-input AND circuit 100e, and a 3-input AND circuit 100f, each of which is connected to necessary ones of input terminals 1c to 1e. Operation of bar graph decoder 101 will now be described. Referring to FIG. 15B, any of "000" to "111" is input to digital input terminals 1c (MSB) to 1e (LSB), the input data is converted in logic circuit unit 100 according to the digital input, and SEL1 to SEL7 which are switch select signals continuously output enable signals of the above described switches $S_0$ to $S_{n-1}$ or the like. When "000 (=0 in decimal numeral)" is input for example, all logic gates and composite gates output "0". Therefore, seven output terminals 101a to 101g all output "0". Then, when "001 (=1)" is input, only 3-input OR circuit 100a outputs "1". Therefore, only switch select signal SEL1 attains "1". Further, when "010 (=2)" is input, 3-input OR circuit 100a and 2-input OR circuit 100b output "1". Therefore, switch select signals SEL1 and SEL2 attain "1". The similar operation is repeated, so that, when "111 (=7)" is input, seven output terminals 101a to 101g all output "1".

Then, a 5-bit bar graph decoder configured of more practical logic and composite gates will be described as the conventional bar graph decoder with reference to FIGS. 16 and 17. FIG. 16 is a schematic diagram showing the entire configuration of a conventional 5-bit bar graph decoder 102. Referring to FIG. 16, 5-bit bar graph decoder 102 includes 5-bit input terminals 1a to 1e, a predecoder 103 connected to input terminals 1b to 1e, a decoder 104 connected to predecoder 103 and input terminal 1a, and output terminals outputting switch select signals SEL1 to SEL32 from decoder 104.

Respective digital inputs (B5, B4, B3, B2, B1) are input to input terminals 1a to 1e. Predecoder 103 includes 15 logic gates DEC1 to DEC15 and composite gates connected to necessary ones of input terminals 1a to 1e. Decoder 104 includes 16 blocks each formed of a 2-NAND circuit and a 2-NOR circuit.

Description will now be given of operation of bar graph decoder 102 with reference to FIGS. 17A and 17B. FIG. 17A shows input data B1 to B4 input to input terminals 1b to 1e receiving data for four bits from the LSB of the 5-bit input data, and output data with respect to the input data from logic gates DEC1 to DEC15 configuring predecoder 103. FIG. 17B shows the content of digital data B5 to B1 input to input terminals 1a to 1e and switch select signals SEL1 to SEL31 output from decoder 104.

Referring to FIGS. 17A and 17B, "00000" to "11111" are input to input terminals 1a (MSB) to 1e (LSB). In response to the digital input, switch select signals SEL1 to SEL31 continuously output an enable signal. In FIG. 16, switch select signal SEL32 is an output caused by the regularity of arrangement of the same logic circuits. Switch select signal SEL32 is a dummy output, and not used practically.

When "00000 (=0)" is input for example, all the logic gates and composite gates in predecoder 103 output "1", as shown in FIG. 17A. Therefore, switch select signals from 31 output terminals all attain "0" as shown in FIG. 17B. Then, when "00001 (=1)" is input, only DEC1 which is a 4-input NOR logic gate in predecoder 103 outputs "0". Therefore, only switch select signal SEL1 attains "1". Further, when "00010 (=2)" is input, logic gates DEC1 and DEC2 in predecoder 103 output "0". Therefore, switch select signals SEL1 and SEL2 attain "1". The similar operation is repeated, so that 31 output terminals all output "1" when "11111 (=31)" is input.

The conventional bar graph decoder was configured as described above. Therefore, when an output corresponding to a 5-bit input was to be obtained for example, an assembly of two logic circuits of a predecoder and a decoder was required. Further, the predecoder was configured of logic gates and composite gates, leading to a complicated structure and a large number of elements.

SUMMARY OF THE INVENTION

One object of the present invention is to provide a bar graph decoder having a simple configuration and a smaller number of elements.

Another object of the present invention is to provide a bar graph decoder whose layout is easy.

Still another object of the present invention is to provide a bar graph decoder which is more practical and configured simply.

A further object of the present invention is to provide a bar graph decoder having a simple configuration and no signal delay.

The above objects of the present invention are achieved by a bar graph decoder including the following elements. More specifically, in one aspect of the present invention, the bar graph decoder outputting thermometer data changing continuously at a constant ratio in response to a digital input signal formed of a plurality of bits includes a terminal inputting the digital input signal, a unit for preparing output data based on each bit of the plurality of bits forming the input digital input signal, and a terminal outputting the prepared data, wherein the preparing unit is configured only of a 2-input OR circuit and a 2-input AND circuit.

Since the unit preparing an output signal corresponding to the input digital data is configured only of a 2-input OR circuit and a 2-input AND circuit, a bar graph decoder having a simple configuration and a small number of elements can be provided.

Preferably, the 2-input OR circuit and the 2-input AND circuit configuring the bar graph decoder form a pair, and the preparing unit is configured of a plurality of the pairs.

Since the preparing unit is configured of a plurality of pairs of 2-input OR circuits and 2-input AND circuits, a bar graph decoder having a simple configuration, a small number of elements, and an easy layout can be provided.

In another aspect of the present invention, the bar graph decoder outputting thermometer data changing continuously at a constant ratio in response to a digital input signal formed of a plurality of bits includes a terminal inputting the digital input signal, a unit preparing output data based on each bit of the plurality of bits forming the input digital input signal, and a terminal outputting the prepared data, wherein the preparing unit is configured only of a 2-input NOR circuit, a 2-input NAND circuit, and an inverter.

Since the preparing unit is configured using practical logic gates, a bar graph decoder which is more practical and which has a simple configuration and a small number of elements can be provided.

Preferably, the number of stages of logic gates up to the output terminals in the preparing unit is different according to the input terminals, and the bar graph decoder further includes an adjuster for adjusting a difference in time required for each bit to pass through the logic gates due to a difference in the number of stages of the logic gates.

Since the adjuster for adjusting a difference in time required for each bit to pass through the logic gates due to a difference in the number of stages of the logic gates configuring a bar graph decoder is provided, a bar graph decoder can be provided which has a simple configuration and a small number of elements, and which causes no signal delay.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a diagram showing input and output data of the bar graph decoder according to the first embodiment.

FIG. 4 is a diagram showing input data and output data in the second embodiment.

FIG. 8 is a diagram showing input data and output data in the third embodiment.

FIGS. 17A and 17B are diagrams showing data input to the conventional bar graph decoder and data output therefrom.

DESCRIPTION OF THE PREFERRED EMBODIMENTS

Embodiments of the present invention will be described hereinafter with reference to the drawings.

(1) First Embodiment

Figure 1:
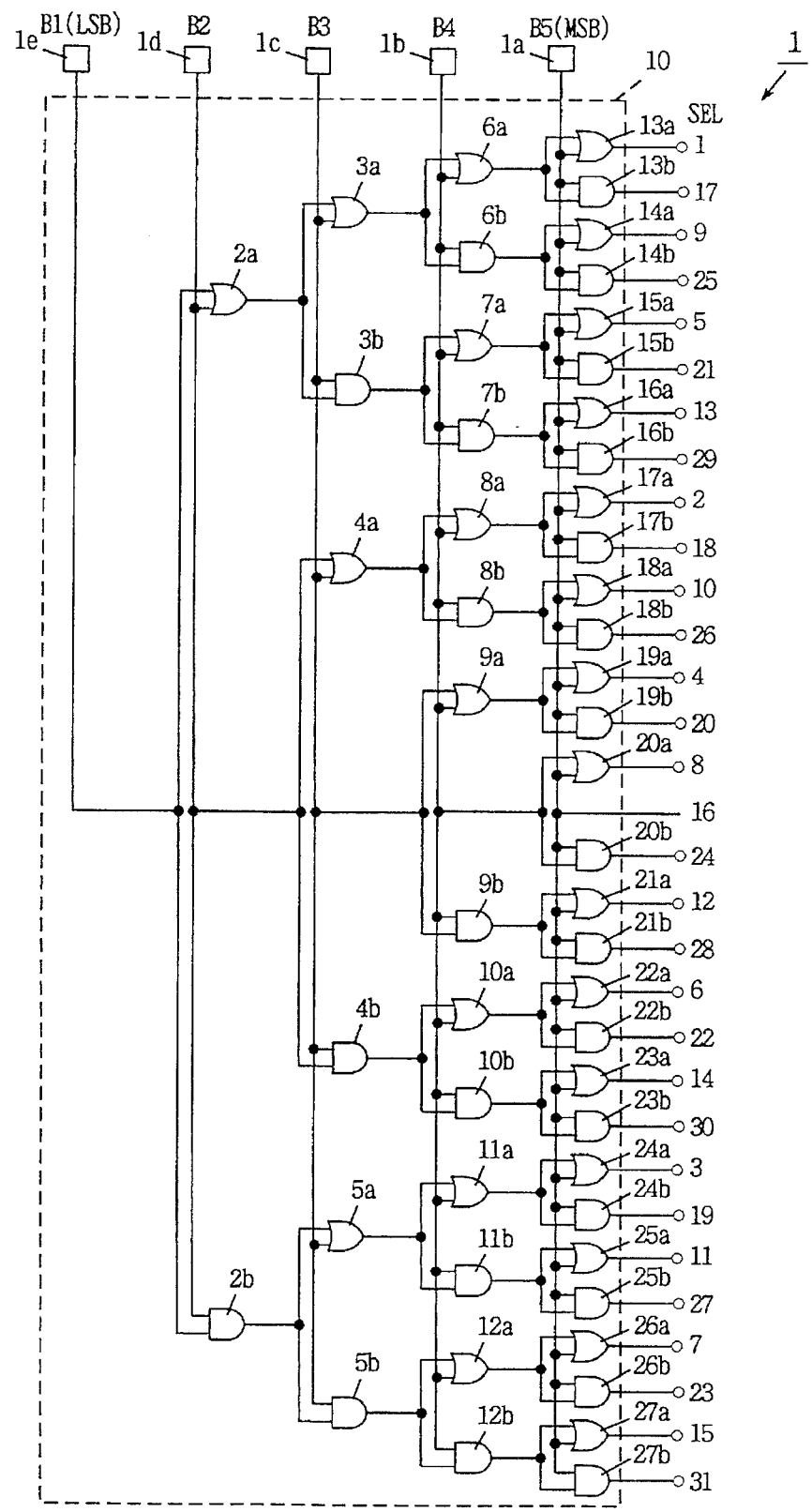
FIG. 1 is a schematic diagram showing the configuration of a bar graph decoder according to a first embodiment.

Referring to FIG. 1, a bar graph decoder 1 according to the first embodiment includes input terminals $1a$ to $1e$ to which digital inputs (B5, B4, B3, B2, B1) are input, a logic circuit unit 10 connected to input terminals $1a$ to $1e$ and preparing a predetermined output signal, and output terminals connected to logic circuit unit 10 and outputting switch select signals SEL1 to SEL31. Logic circuit unit 10 includes a 2-input OR circuit $2a$ and a 2-input AND circuit $2b$ receiving a signal from input terminal $1e$ and a signal from input terminal $1d$, a 2-input OR circuit $3a$ and a 2-input AND circuit $3b$ receiving an output from 2-input OR circuit $2a$ and an input signal from input terminal $1c$, a 2-input OR circuit $4a$ and a 2-input AND circuit $4b$ receiving a signal from input terminal $1b$ and a signal from input terminal $1c$, a 2-input OR circuit $5a$ and a 2-input AND circuit $5b$ receiving an output from 2-input AND circuit $2b$ and an input signal from input terminal $1c$, and 2-input OR circuits $6a$ to $27a$ and 2-input AND circuits $6b$ to $27b$ each similarly receiving an output signal from a 2-input OR circuit or a 2-input AND circuit at a stage preceding thereto and input signals from input terminals $1b$ and $1a$. Switch select signals SEL1 to SEL31 are output from 2-input OR circuits $13a$ to $27a$ and 2-input AND circuits $13b$ to $27b$ receiving an input signal from input terminal $1a$ and outputs from 2-input OR circuits $6a$ to $12a$ or 2-input AND circuits $6b$ to $12b$ provided at a stage preceding to input terminal 1. Referring to FIG. 1, since the 2-input OR circuits and the 2-input AND circuits are arranged regularly according to each input terminal, the bar graph decoder according to the first embodiment can be applied to an infinite-bit bar graph decoder ideally. However, for simplification of description, a 5-bit bar graph decoder is taken as an example here.

Operation of the bar graph decoder according to the first embodiment will now be described. FIG. 2 shows the content of respective digital inputs (B5, B4, B3, B2, B1) input to input terminals $1a$ to $1e$ of bar graph decoder 1 shown in FIG. 1, and switch select signals SEL1 to SEL31 output according to the digital inputs. Referring to FIGS. 1 and 2, "00000" to "11111" are input to digital input terminals $1a$ to $1e$. In response to the digital input, switch select signals SEL1 to SEL31 continuously output an enable signal.

When "00000 (=0)" is input for example, all the logic gates output "0". Therefore, 31 decoder outputs all attain "0". Then, when "00001 (=1)" is input, 2-input OR circuit $2a$ outputs "1", and consequently, 2-input OR circuits $3a$, $6a$ and $13a$ output "1". As a result, SEL1 of FIG. 1 outputs "1". When "00010 (=2)" is input, 2-input OR circuits $2a$ and $4a$ output "1", and consequently, 2-input OR circuits $3a$, $6a$ and $13a$ and 2-input OR circuits $8a$ and $17a$ output "1". Therefore, SEL1 and SEL2 output "1". Further, when "00011 (=3)" is input, 2-input OR circuits $2a$ and $4a$ and 2-input AND circuit $2b$ output "1". As a result, 2-input OR circuits $3a$, $6a$ and $13a$, 2-input OR circuits $8a$ and $17a$ and 2-input OR circuits $5a$, $11a$ and $24a$ output "1". Therefore, switch select signals SEL1 to SEL3 of FIG. 1 output "1". The similar operation is repeated, so that when "11111" (=31)" is input, 31 decoder outputs all attain "1".

As described above, in the bar graph decoder according to the first embodiment, logic circuit unit 10 of the bar graph decoder is configured only of the 2-input OR circuits and the 2-input NAND circuits. Therefore, as compared to a conventional example, the bar graph decoder is configured with the reduced number of elements and only of simple logic gates. As a result, the layout work and the like can be reduced.

(2) Second Embodiment

Figure 3:
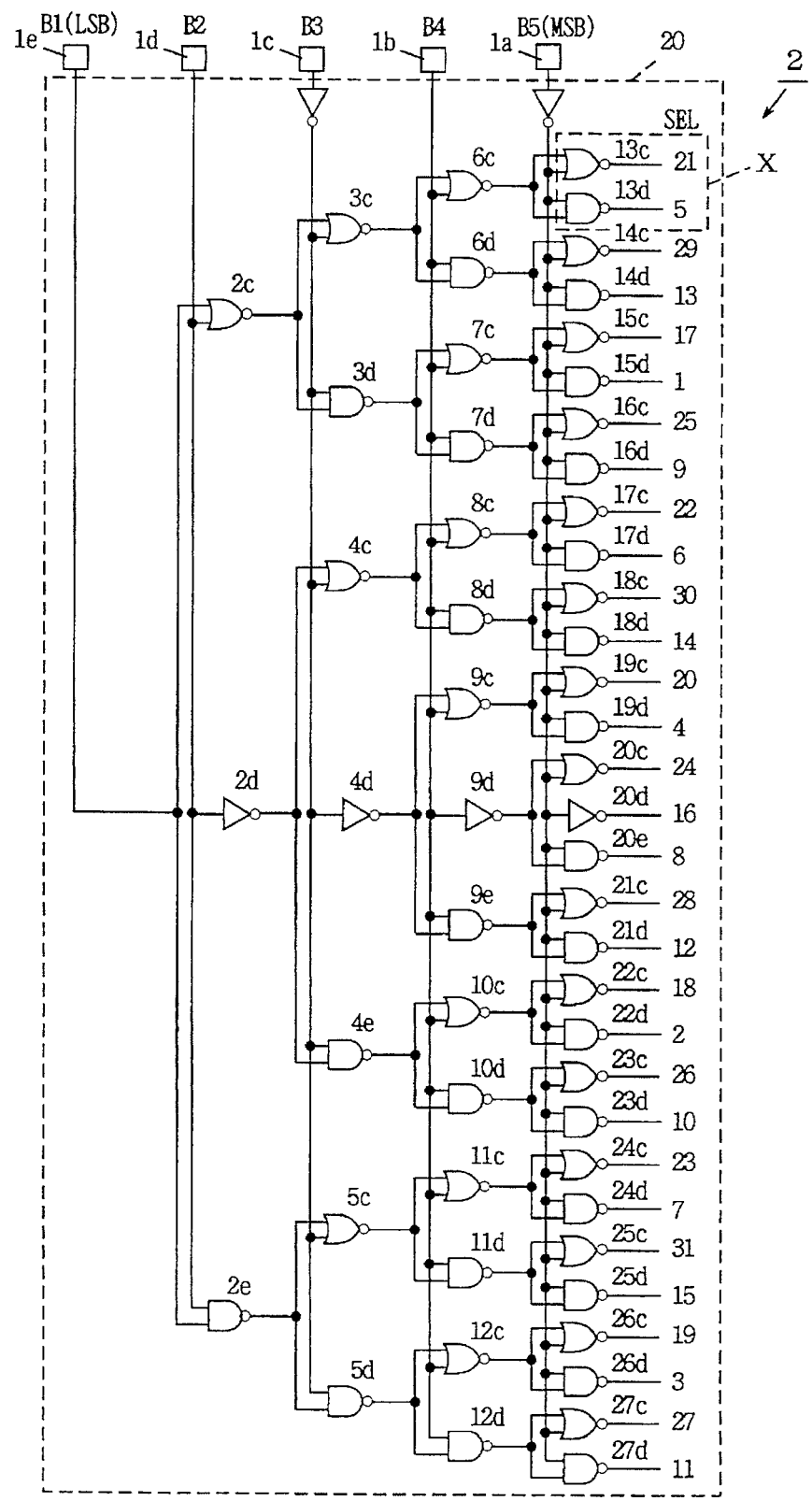
FIG. 3 is a schematic diagram showing the configuration of a bar graph decoder according to a second embodiment.

The second embodiment of the present invention will now be described. FIG. 3 is a schematic diagram showing the configuration of a bar graph decoder 2 according to the second embodiment of the present invention. Also in the second embodiment, an example of a 5-bit bar graph decoder is shown similar to the case of the first embodiment. Referring to FIG. 3, the bar graph decoder according to the second embodiment includes input terminals $1a$ to $1e$ receiving digital inputs (B5, B4, B3, B2, B1), a logic circuit unit 20, and output terminals connected to logic circuit unit 20 for outputting switch select signals SEL1 to SEL31. Referring to FIG. 3, in the second embodiment, logic circuit unit 20 is configured only of 2-input NOR circuits, 2-input NAND circuits and inverters. More specifically, a signal input through input terminal $1e$ and a signal input through input terminal $1d$ are applied to a 2-input NOR circuit $2c$ and a 2-input NAND circuit $2e$, and only the signal input through input terminal $1d$ is applied to an inverter $2d$. Similarly, output data from a logic gate at the preceding stage and input data from a predetermined input terminal are applied to a 2-input NOR circuit, a 2-input NAND circuit and an inverter of the number corresponding to the input terminal. Finally, switch select signals SEL1 to SEL31 are output from 2-input NOR circuits $13c$ to $27c$, 2-input NAND circuits $13d$ to $27d$ and an inverter $20d$.

Figure 5A:
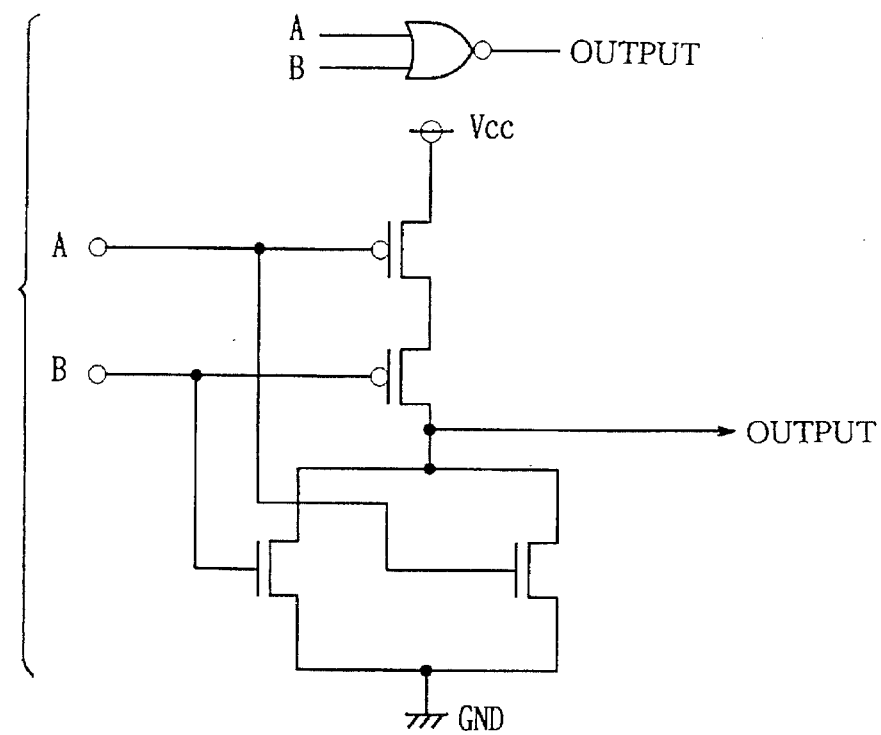
FIGS. 5A and 5B are diagrams showing the configuration of a logic circuit which is actually used.
Figure 5B:
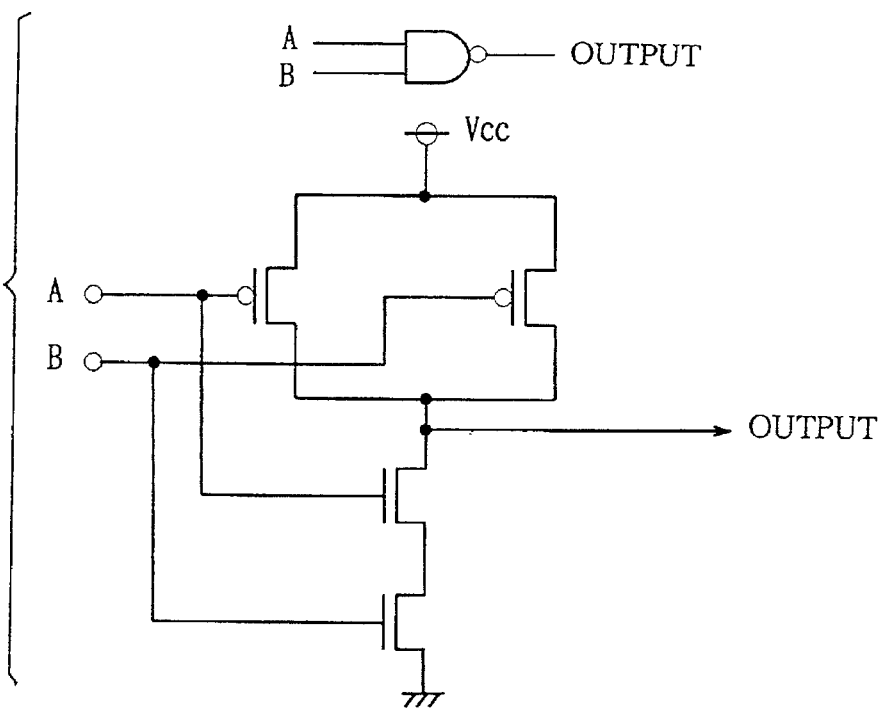

FIG. 4 is a diagram showing input data to bar graph decoder 2 in the second embodiment and output data corresponding to the input data. Since the circuit operation in the second embodiment is basically the same as that of the first embodiment shown in FIG. 1, the description thereof will not be repeated. In the second embodiment, although the number of elements is greater than that of the first embodiment by 12 gates, the logic circuit unit can be configured only of simple logic gates such as 2-input NOR circuits, 2-input NAND circuits and inverters. Therefore, the layout work can be reduced. Further, since the logic gate actually formed on a semiconductor device is an NOT system logic circuit such as an NOR circuit (cf. FIG. 5A) and an NAND circuit (cf. FIG. 5B) as shown in FIG. 5, the bar graph decoder of the second embodiment is suitable for actual implementation on a semiconductor.

Note that inverters provided at input terminals $1a$ and $1c$ in FIG. 3 are for adjustment of input data.

Figure 6:
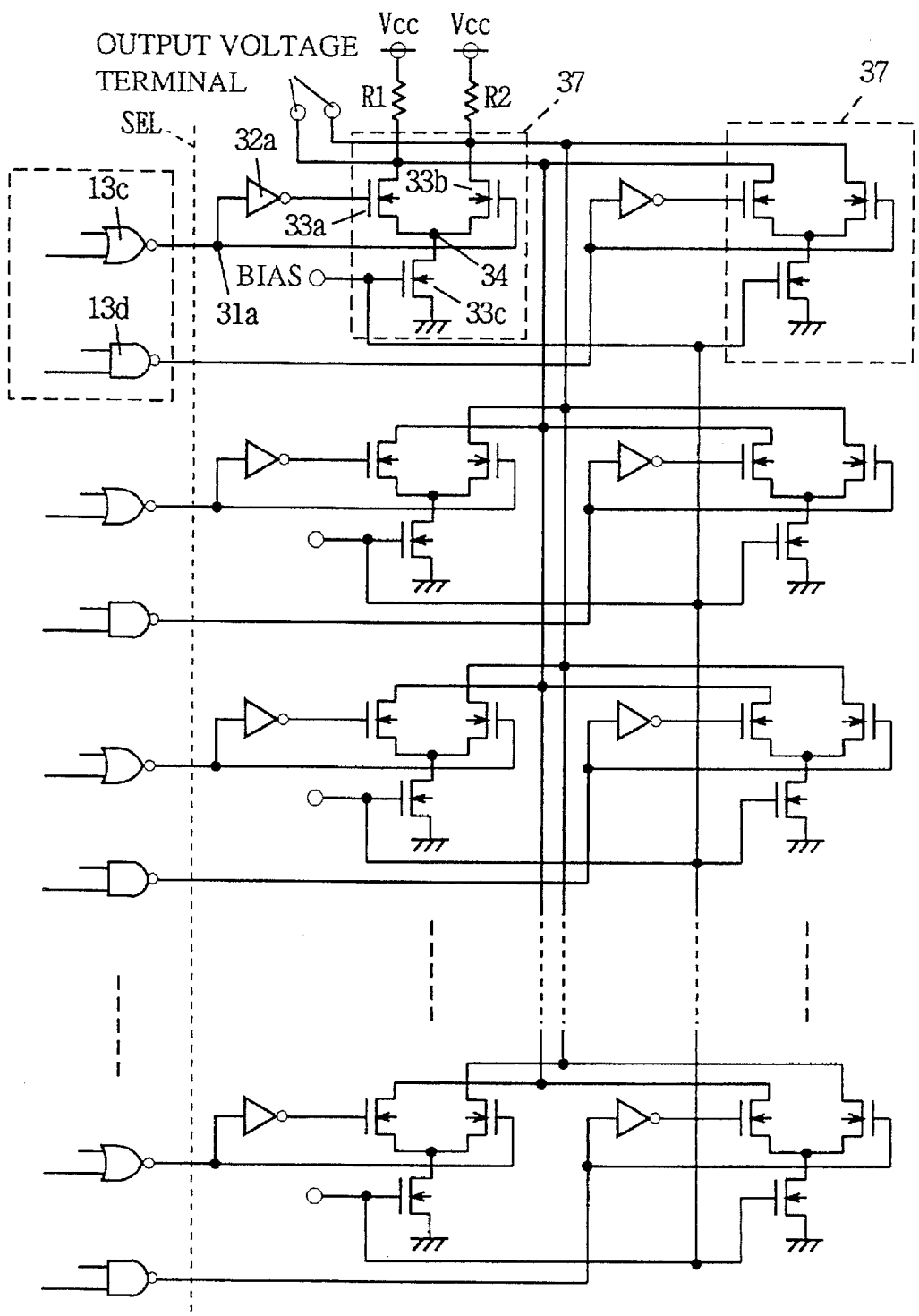
FIG. 6 is a circuit diagram showing the configuration of a current source circuit.

FIG. 6 is a diagram showing a circuit provided at a stage succeeding to output terminals outputting switch select signals SEL1 to SEL31 shown in FIG. 3. FIG. 6 includes a portion indicated by X of FIG. 3. Referring to FIG. 6, a current source circuit 37 is provided at a stage succeeding to 2-input NOR circuit 13c shown in FIG. 3, and an output signal from the bar graph decoder is output from current source circuit 37. Referring to FIG. 6, a 2-input NOR circuit 13c is connected to a node 31a. Node 31a is connected to the gates of p channel MOS transistors 33a and 33b configuring current source circuit 37 through an inverter 32a on one hand, and directly on the other hand. Current source circuit 37 includes a resistor R1 provided between a power supply potential Vcc and a node 34 in series, p channel MOS transistor 33b, a resistor R2 provided between the power supply potential Vcc and node 34 in series, and p channel MOS transistor 33a. A p channel MOS transistor 33c having its gate connected to a bias potential is provided between node 34 and a ground potential. An output from current source circuit 37 is provided from an output terminal connected to a node provided between resistor R1 and p channel MOS transistor 33a or between resistor R2 and n channel MOS transistor 33b.

Operation will now be described. Irrespective of values of switch select signals SEL1 to SEL31, either p channel MOS transistor 33a or p channel MOS transistor 33b is turned on. Therefore, there is always a current flow through resistors R1 and R2. As an output from current source circuit 37, a predetermined output voltage is obtained at an output voltage terminal on one side, since there is a predetermined current flow through p channel MOS transistor 33a connected to inverter 32a if the value of switch select signal SEL21 is "1". If the value is "0", p channel MOS transistor 33b not connected to inverter 32a is turned on, and an output voltage obtained at an output voltage terminal on the other side.

In FIG. 6, although both positive and negative output voltages are obtained, only one of them may be output. Since a sum of outputs from respective switch select signals SEL is output from the output voltage terminal as shown in the figure, an output corresponding to the values of the switch select signals is obtained.

(3) Third Embodiment

The third embodiment of the present invention will now be described with reference to FIG. 7. Also in the third embodiment, input data is 5-bit data similar to the cases of the first and second embodiments.

Figure 7:
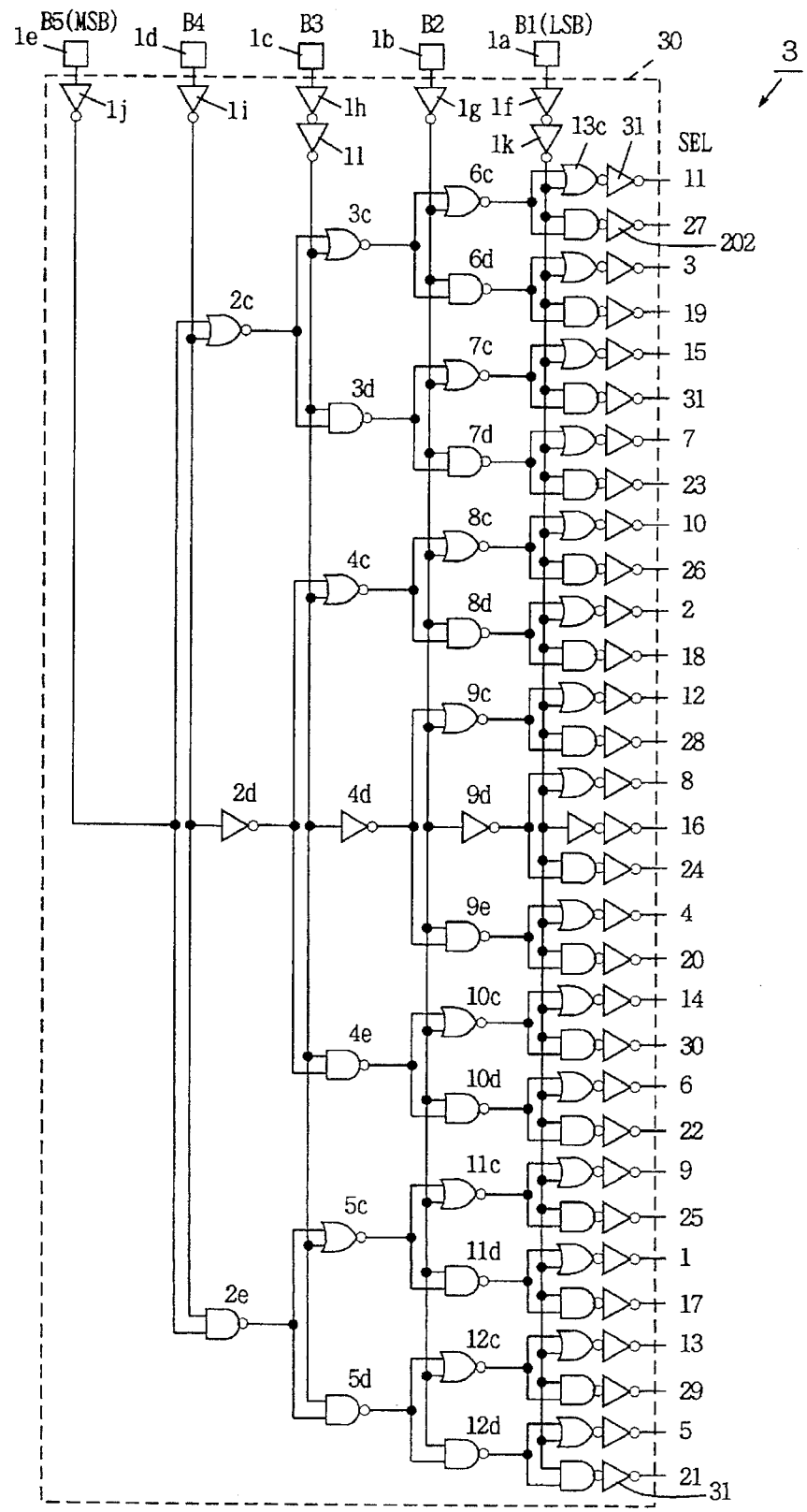
FIG. 7 is a schematic diagram showing the configuration of a bar graph decoder according to a third embodiment.

Referring to FIG. 7, in a bar graph decoder 3 of the third embodiment, a logic circuit unit 30 includes inverters 1f to 1j connected to input terminals 1a to 1e. Other than that, the basic configuration of logic circuit unit 30 is similar to the case of the second embodiment. Logic circuit unit 30 is configured of 2-input NOR circuits, 2-input NAND circuits and inverters, which are logic gates used in practical implementation. In the third embodiment, inverters 31 are provided to logic gates 13c to 27d at the final stage connected to input terminal 1a, respectively.

Since operation of the circuit of the third embodiment is similar to those of the first and second embodiments, the description thereof will not be repeated.

FIG. 8 is a diagram showing the contents of input signals and output signals in the third embodiment. In the third embodiment, the digital input signals are applied in a manner opposite to the cases of the first and second embodiments, and their outputs are also different from the cases of the first and second embodiments as shown in the figure. Although the number of elements is increased as compared to the first and second embodiments, the third embodiment also has an advantage that the bar graph decoder can be configured only of simple logic gates. As compared to the second embodiment, the third embodiment includes inverter circuits on the input side and on the output side to carry out waveform shaping of input and output signals.

Figure 9A:
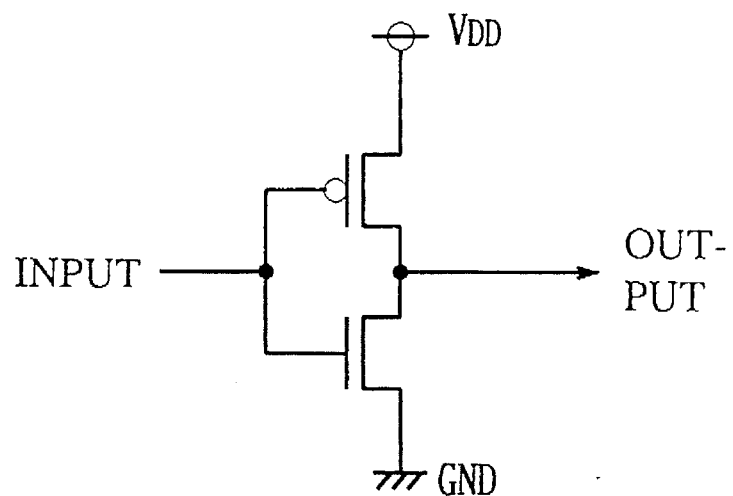
FIGS. 9A and 9B are diagrams for explaining waveform shaping operation of an inverter.
Figure 9B:
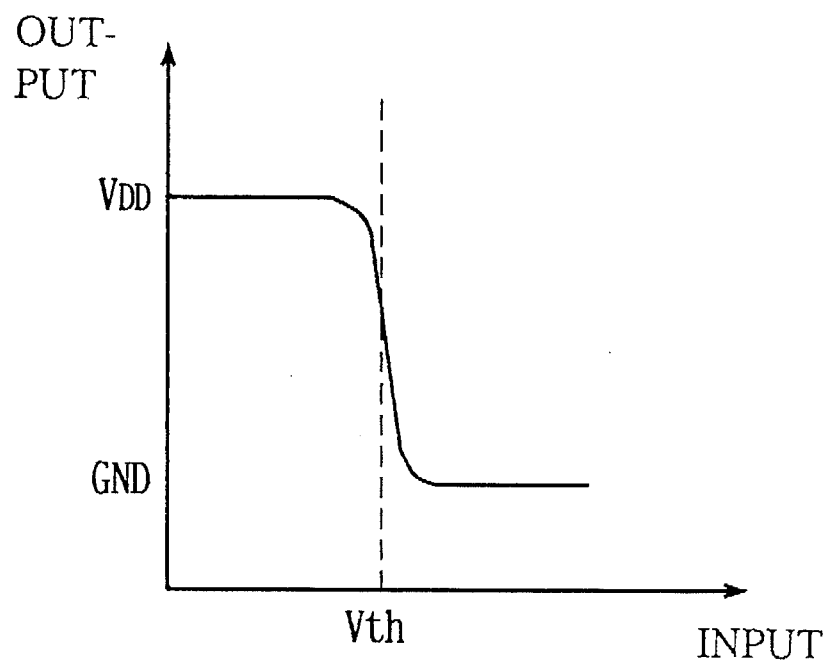

FIG. 9A shows an inverter circuit, and FIG. 9B shows the relationship between the input signal and the output signal of the inverter circuit. Referring to FIG. 9, description will be given of waveform shaping of a signal by the inverter circuit. When the inverter circuit is not provided, data may not be output correctly because of an ambiguous value of the input signal. On the other hand, by providing the inverter, the signal levels can be reliably differentiated at the threshold value Vth as shown in FIG. 9B. Therefore, an ambiguous level does not cause erroneous data.

Since inverters 31 provided in FIG. 7 are used as inverters 32a provided in FIG. 6, the number of elements does not increase so much as compared to the second embodiment, when current source circuit 37 is taken into consideration.

(4) Fourth Embodiment

Figure 10:
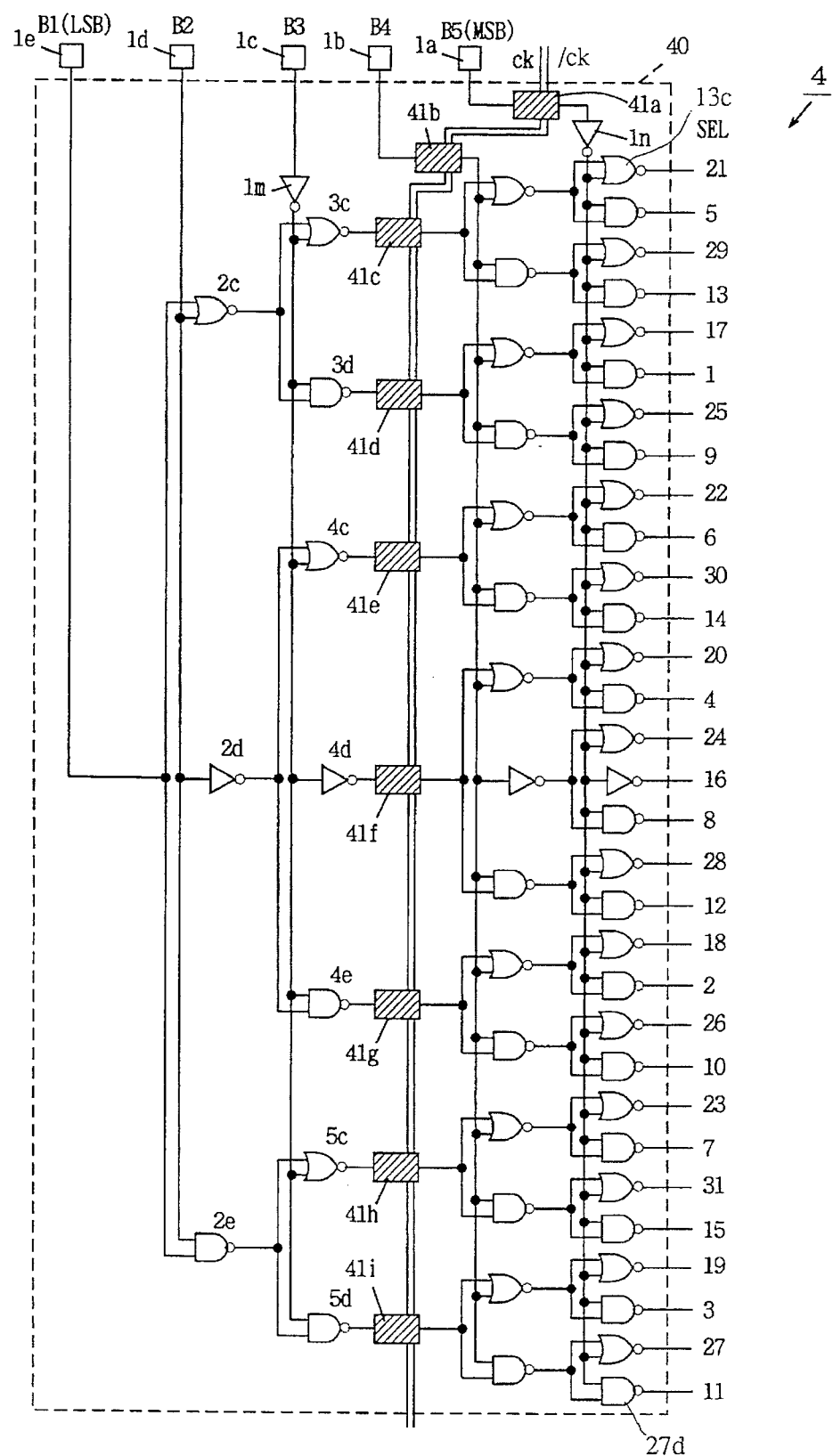
FIG. 10 is a schematic diagram showing the configuration of a bar graph decoder according to a fourth embodiment.

The fourth embodiment of the present invention will now be described with reference to FIG. 10. Referring to FIG. 10, a bar graph decoder 4 according to the fourth embodiment includes input terminals 1a to 1e, a logic circuit unit 40 connected to input terminals 1a to 1e, and output terminals connected to logic circuit unit 40 for outputting switch select signals SEL1 to SEL31. Similar to the cases of the second and third embodiments, input data is 5-bit data, and the bar graph decoder is configured of 2-input NOR circuits, 2-input NAND circuits and inverter circuits, which are logic gates used in practical implementation, also in the fourth embodiment. Referring to FIG. 10, the fourth embodiment is different from the second embodiment in that latch circuits 41a to 41i are provided.

Operation will now be described. When digital input signals are simultaneously applied to input terminals 1a to 1e in the second and third embodiments, there is a possibility of a skew (signal delay) occurring in signals arriving at logic gates before final output due to the difference in the number of stages of logic gates. This is a problem particularly in high speed operation. Therefore, in the fourth embodiment, the latch circuits are provided to minimize the skew.

More specifically, referring to FIG. 10, input data applied to input terminals 1a and 1b pass through logic gates of one stage before they arrive at logic gates 13c to 27d before final output. On the other hand, input data applied to input terminals 1c to 1e pass through logic gates of two or three stages before they arrive at logic gates 13c to 27d before final output. Therefore, by providing latch circuits 41a to 41i next to input terminals in the case of input terminals 1a and 1b, and between logic gates of the second and third stages in the case of input terminals 1c to 1e, the skew caused by the difference in the number of stages of logic circuits is prevented.

Figure 11:
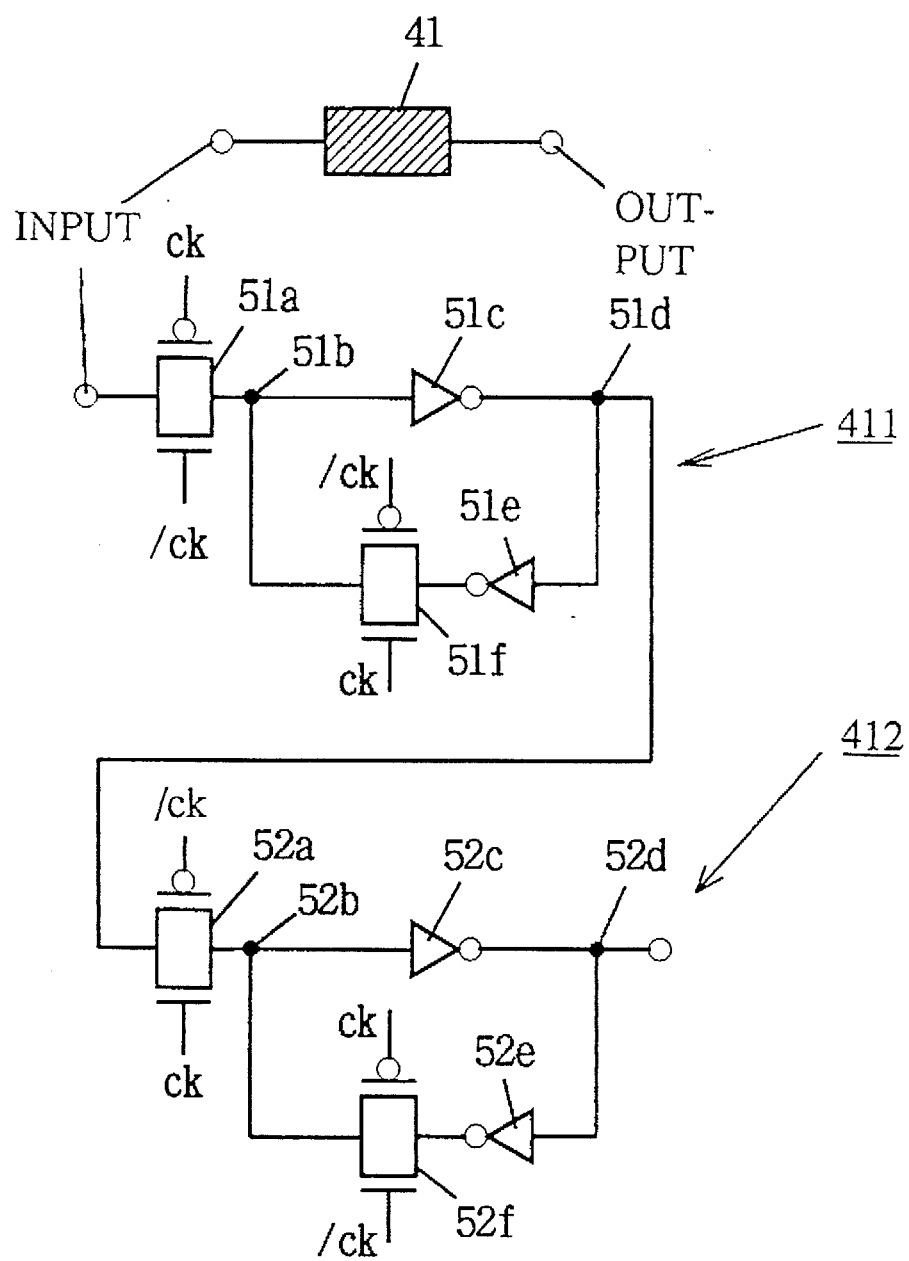
FIG. 11 is a circuit diagram showing the configuration of a latch circuit.

FIG. 11 is a schematic diagram showing the configuration of latch circuits 41a to 41i. Referring to FIG. 11, latch circuit 41 includes two stages of latch circuit elements 411 and 412. Respective latch circuit elements 411 and 412 include transfer gates 51a and 52a operating in response to clocks ck and/ck (indicating inversion of ck) connected to the input terminal, inverters 51c, 52c, 51e and 52e connected to transfer gates 51a and 52a, and transfer gates 51f and 52f connected to inverters 51e and 52e and operating in response to clock signals ck and/ck. An output signal is output from latch circuit 41 through a node 52d of latch circuit element 412.

Since clock signals ck and/ck contrary to each other are applied to transfer gates 51a, 51f, 52a and 52f, respectively, an input signal is latched according to the clock signals. Note that the latch circuit is configured in two stages for matching logics of the input signal and the output signal.

As described above, according to the fourth embodiment, since the bar graph decoder is configured only of simple logic gates, the layout work can be reduced. At the same time, provision of the latch circuits enables suppression of the skew, which is a problem in high speed operation. It is not generally determined how many latch circuits should be provided in which portion of the decoder, since they are concerned with the operation speed of the decoder and the number of bits of digital data to be input.

More specifically, the operation speed of the bar graph decoder determines the delay time accepted by the logic gates, and the number of bits of digital data to be input determines the number of stages of the gates. Therefore, by taking the operation speed and the number of bits into consideration generally, it must be determined how many latches should be provided in which portion of the decoder.

Note that input data and output data in the fourth embodiment are similar to those of the second embodiment shown in FIG. 4.

(5) Fifth Embodiment

Figure 12:
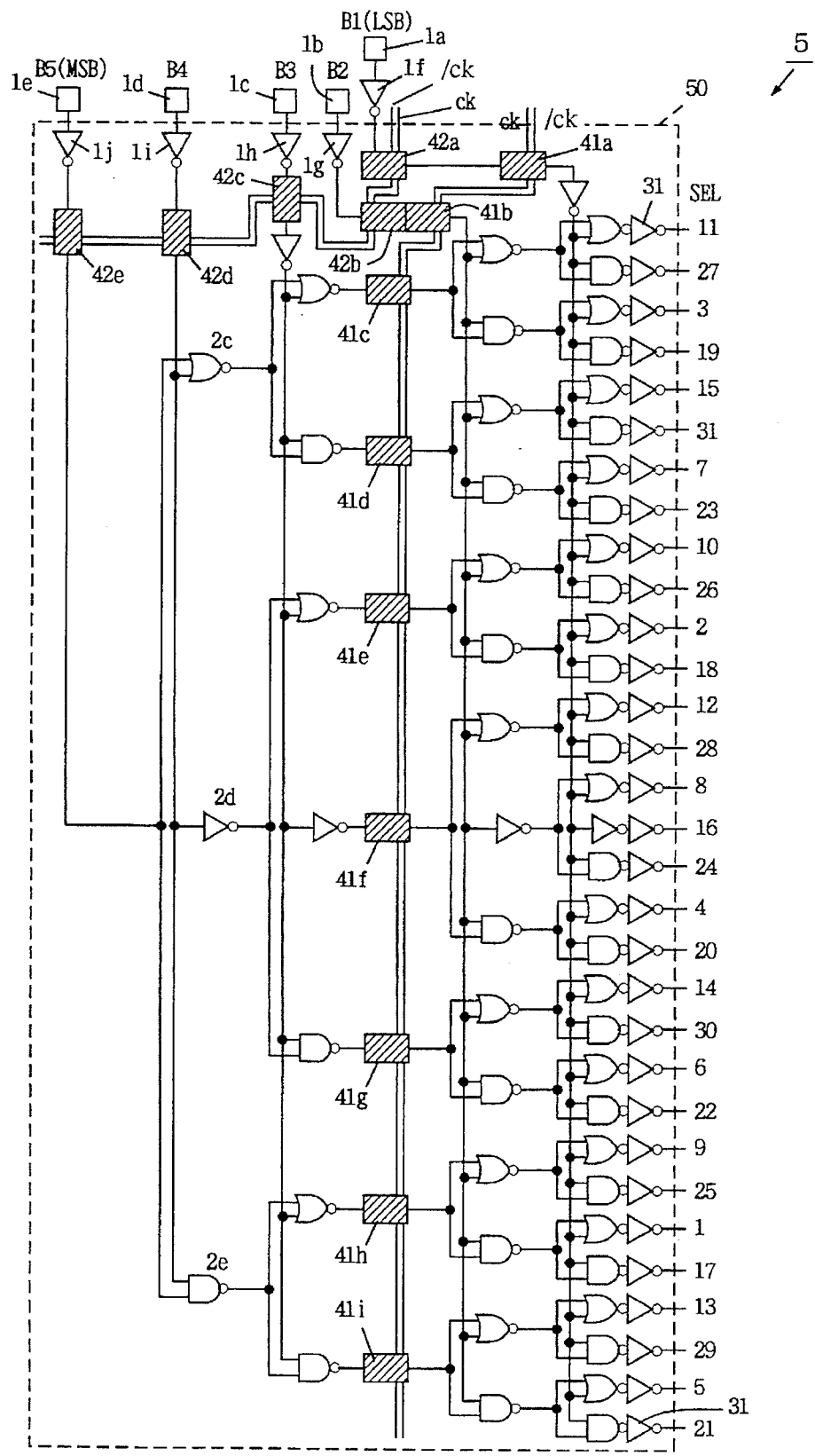
FIG. 12 is a schematic diagram showing the configuration of a bar graph decoder according to a fifth embodiment.
Figure 13:
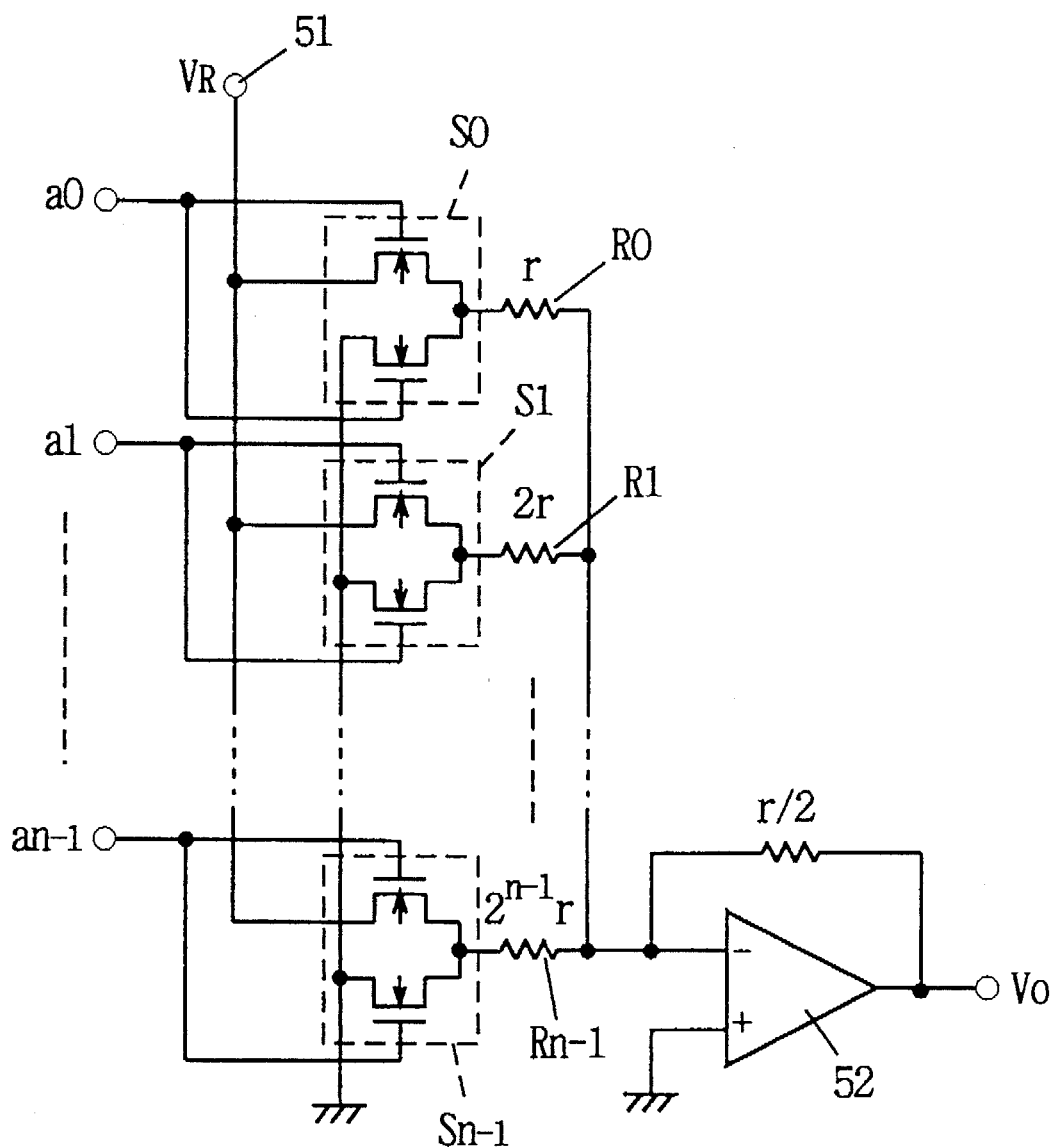
FIG. 13 is a schematic diagram showing the configuration of a conventional D/A converter.
Figure 14:
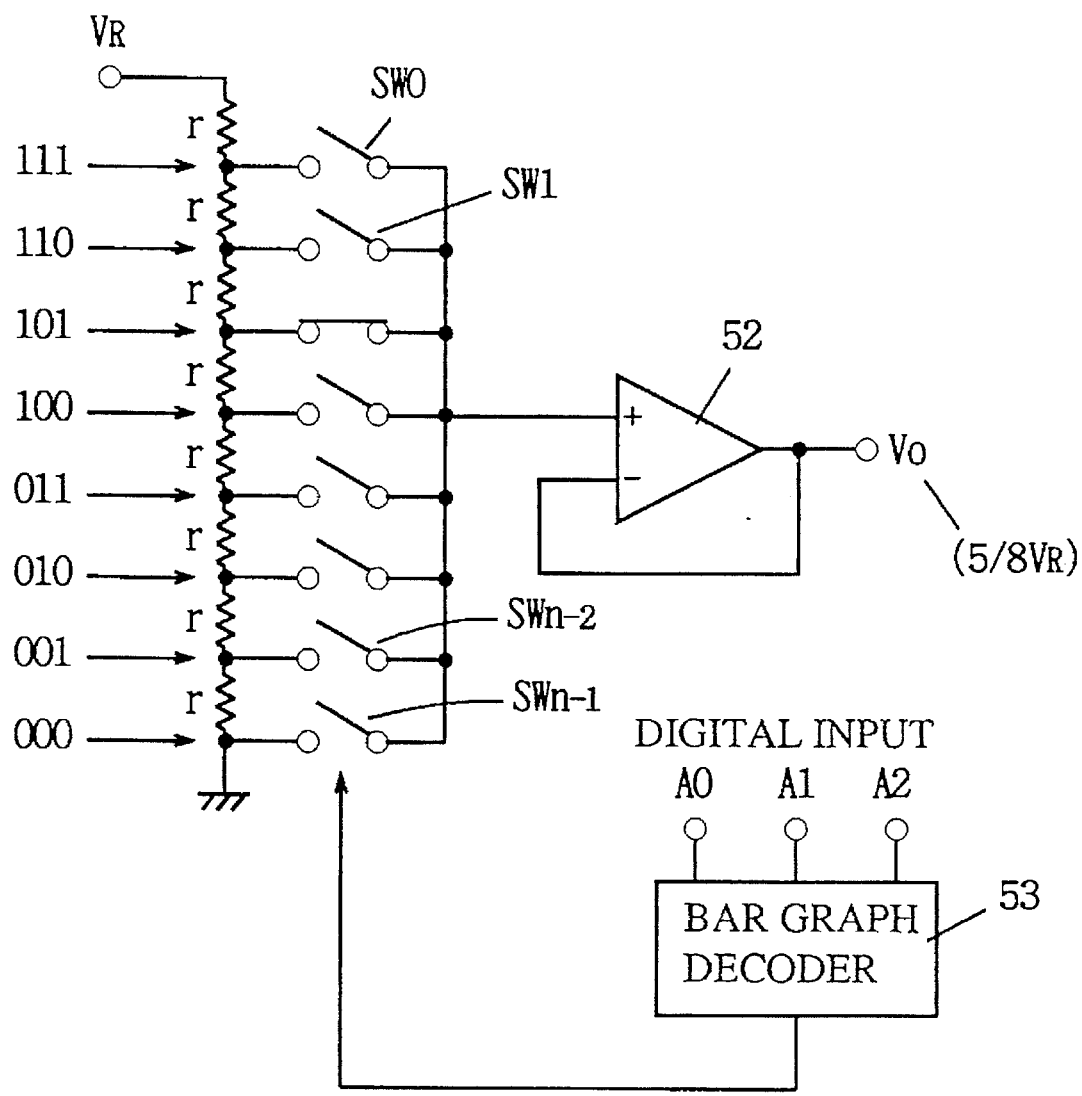
FIG. 14 is a schematic diagram showing the configuration of the conventional D/A converter.
Figures 15A, 15B:
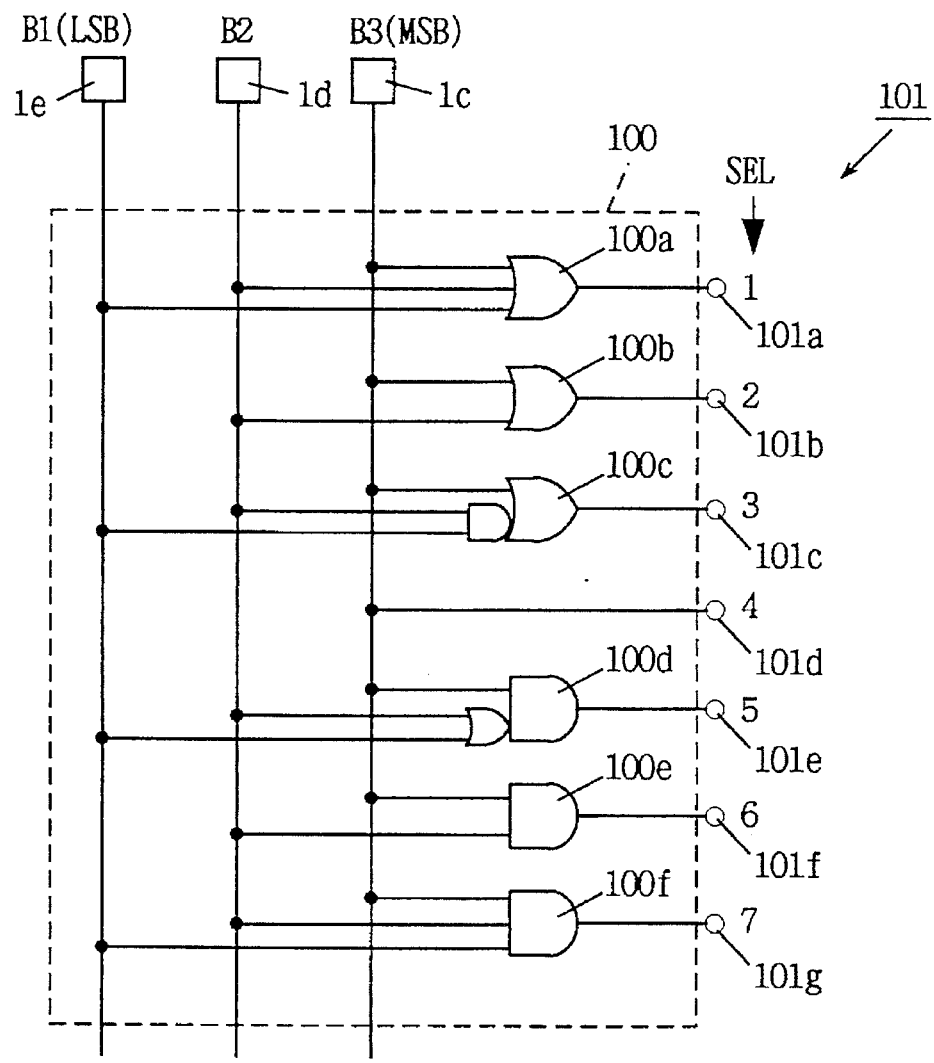
FIGS. 15A and 15B are schematic diagrams showing the configuration of a conventional bar graph decoder.
Figure 16:
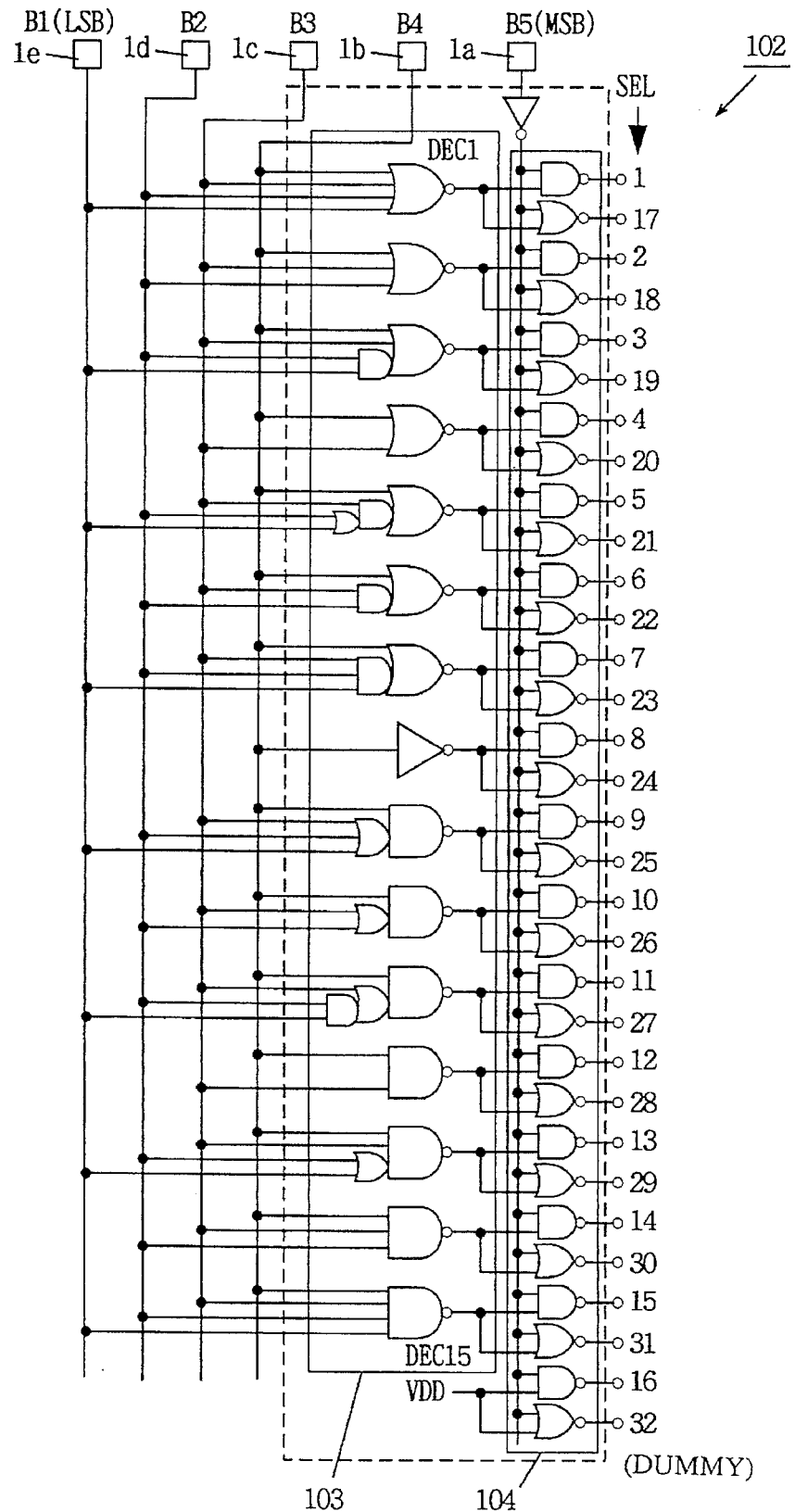
FIG. 16 is a schematic diagram showing the configuration of the conventional bar graph decoder.

The fifth embodiment of the present invention will now be described with reference to FIG. 12. Also in this embodiment, the case of a 5-bit digital input signal is described similar to the cases of the other embodiments. Although the circuit configuration is approximately the same as that of the fourth embodiment shown in FIG. 10, the fifth embodiment is different from the fourth embodiment in that input side latch circuits 42a to 42e are provided at the next stage of input terminals 1a to 1e through inverters 1f to 1j, and that inverters 31 are provided at the next stage of logic gates 13c to 27d of the final output stage similar to the third embodiment.

In the fifth embodiment, provision of input side latch circuits 42a to 42e enables suppression of signal delay at the time of input, unlike the fourth embodiment. In addition, the similar effect as that of the third embodiment can be expected by provision of inverters 31.

Since operation in the fifth embodiment is basically the same as that of the fourth embodiment, the description thereof will not be repeated. Further, the configuration of input side latch circuits 42a to 42e is the same as that described with reference to FIG. 11.

As described above, according to the fifth embodiment, in addition to the effect obtained in the fourth embodiment, even if there is a delay in data in the input portion, timings can be matched by input side latch circuits 42a to 42e, and therefore, the skew can be minimized. It cannot be determined generally how many latch circuits should be provided in which portion of bar graph decoder 5, since they are concerned with the operation speed of the bar graph decoder and the number of bits of digital data to be input.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A bar graph decoder outputting thermometer data changing continuously at a constant ratio in response to a digital input signal formed of a plurality of bits, comprising:

means for inputting said digital input signal;

means for preparing said thermometer data based on each bit of the plurality of bits forming said input digital input signal; and means for outputting said prepared data, wherein said preparing means is configured of logic gates consisting only of 2-input OR and 2-input AND circuits.

2. The bar graph decoder as recited in claim 1, wherein 2-input OR and 2-input AND circuits form a pair, and said preparing means is configured of a plurality of said pairs.

3. The bar graph decoder as recited in claim 1, wherein said means for inputting said digital input signal includes a plurality of input terminals corresponding to said plurality of bits, said preparing means includes a logic circuit including said 2-input OR circuits and said 2-input AND circuits respectively corresponding to said plurality of input terminals, and the number of stages of said logic circuits leading to said means for outputting said prepared data in said preparing means varies according to said input terminals.

4. The bar graph decoder as recited in claim 3, wherein the numbers of said 2-input AND circuits and said 2-input OR circuits vary according to the number of stages of said logic circuits.

5. A bar graph decoder outputting thermometer data changing continuously at a constant ratio in response to a digital input signal formed of a plurality of bits, comprising:

an input terminal inputting said digital input signal; means for preparing said thermometer data based on each bit of the plurality of bits forming said input digital input signal; and a terminal outputting said prepared data, wherein said preparing means is configured of logic gates consisting only of 2-input NOR circuits, 2-input NAND circuits and inverter circuits.

6. The bar graph decoder as recited in claim 5, wherein said inverter is connected to said input terminal.

7. The bar graph decoder as recited in claim 5, wherein said inverter is connected to said output terminal.

8. The bar graph decoder as recited in claim 5, wherein the number of stages of said logic circuits leading to said output terminal in said preparing means varies according to said input terminal, said bar graph decoder further comprising means for adjusting a difference in time at which said each bit passes through said logic circuits due to a difference in the number of stages of said logic circuits.

9. The bar graph decoder as recited in claim 8, wherein said means for adjusting the difference in time at which said bit passes through said logic circuits includes a latch circuit.

10. The bar graph decoder as recited in claim 9, wherein said latch circuit is connected to said input terminal.

11. The bar graph decoder as recited in claim 9, wherein said latch circuit is incorporated in the stage of said logic circuits.

12. The bar graph decoder as recited in claim 8, further comprising means for adjusting timings upon application of an input signal to said plurality of input terminals.

13. The bar graph decoder as recited in claim 12, wherein said means for adjusting timings includes a latch circuit.

* * * * *